(12) United States Patent
Mei

(10) Patent No.: US 11,756,797 B2
(45) Date of Patent: Sep. 12, 2023

(54) ETCHING METHOD OF COPPER-MOLYBDENUM FILM AND ARRAY SUBSTRATE

(71) Applicant: TCL CHINA STAR OPTOELECTRONICS TECHNOLOGY CO., LTD., Guangdong (CN)

(72) Inventor: Yuan Mei, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 198 days.

(21) Appl. No.: 16/954,593

(22) PCT Filed: Apr. 23, 2020

(86) PCT No.: PCT/CN2020/086318
§ 371 (c)(1),
(2) Date: Jun. 17, 2020

(87) PCT Pub. No.: WO2021/208126
PCT Pub. Date: Oct. 21, 2021

(65) Prior Publication Data
US 2021/0327721 A1    Oct. 21, 2021

(30) Foreign Application Priority Data

Apr. 15, 2020    (CN) .......................... 202010293568.2

(51) Int. Cl.
*H01L 21/32* (2006.01)
*H01L 21/3213* (2006.01)
(Continued)

(52) U.S. Cl.
CPC .. *H01L 21/32134* (2013.01); *H01L 21/32139* (2013.01); *H01L 27/124* (2013.01); *H01L 27/1288* (2013.01); *G02F 1/1368* (2013.01)

(58) Field of Classification Search
CPC ......... H01L 21/32134; H01L 21/32139; H01L 27/124; H01L 27/1288; G02F 1/1368
(Continued)

(56) References Cited

U.S. PATENT DOCUMENTS 5,935,866 A * 8/1999 Chagnon ................. B82Y 5/00
                                                                428/407
6,221,269 B1 * 4/2001 Sachdev ................. H05K 3/26
                                                                216/101
(Continued)

FOREIGN PATENT DOCUMENTS

CN          1510169 A      7/2004
CN        101594737 A     12/2009
(Continued)

*Primary Examiner* — Ori Nadav
(74) *Attorney, Agent, or Firm* — PV IP PC; Wei Te Chung; Zhigang Ma

(57) ABSTRACT

A etching method of a copper-molybdenum film and an array substrate are provided. The etching method of a copper-molybdenum film includes forming a copper-molybdenum film on a substrate; forming a photoresist in a predetermined pattern on the copper-molybdenum film; etching a copper film of the copper-molybdenum film with an acidic first etching solution; etching a molybdenum film of the copper-molybdenum film with a neutral or basic second etching solution, to form the copper-molybdenum film in the predetermined pattern.

7 Claims, 3 Drawing Sheets

(51) Int. Cl.
*H01L 27/12* (2006.01)
*G02F 1/1368* (2006.01)

(58) Field of Classification Search
USPC .......................................... 438/622
See application file for complete search history.

(56) References Cited

U.S. PATENT DOCUMENTS

| | | | |
|---|---|---|---|
| 11,235,498 B2* | 2/2022 | Kim | C23F 1/36 |
| 2004/0118814 A1* | 6/2004 | Kim | H01L 21/32134 |
| | | | 257/E21.309 |
| 2020/0171722 A1* | 6/2020 | Kim | C23F 1/32 |

FOREIGN PATENT DOCUMENTS

| | | | | |
|---|---|---|---|---|
| CN | 106601596 A | 4/2017 | | |
| CN | 108893741 A | 11/2018 | | |
| JP | 2005023340 A | 1/2005 | | |
| WO | WO-2015075765 A1 * | 5/2015 | ................ | C23F 1/18 |

* cited by examiner

ETCHING METHOD OF COPPER-MOLYBDENUM FILM AND ARRAY SUBSTRATE

CROSS REFERENCE TO RELATED APPLICATIONS

The present disclosure claims the priority of the Chinese Patent Application filed on Apr. 15, 2020 in the Chinese Patent Office with the application number 202010293568.2 and the invention titled "ETCHING METHOD OF COPPER-MOLYBDENUM FILM AND ARRAY SUBSTRATE", the entire contents of which are incorporated herein by reference.

FIELD OF INVENTION

The present disclosure relates to the technical field of array substrate manufactures, and in particular to an etching method of a copper-molybdenum film and an array substrate.

BACKGROUND OF DISCLOSURE

A process for forming a metal pattern in the thin film transistor-liquid crystal device (TFT-LCD) panel includes first forming a metal film on the substrate, then forming a photoresist in a predetermined pattern on the metal film, and finally etching the metal film with an etching solution to form the metal pattern in the predetermined pattern, wherein a double-layer or multi-layer composite film formed of multiple metal materials is employed in some metal patterns in order to maintain desired electrical characteristics. Generally, in a copper-molybdenum film, the role of molybdenum is to increase adhesion of copper to the substrate and prevent copper from diffusing to unspecified regions of the substrate. However, etching characteristics in a conventional etching process of the copper-molybdenum film are prone to change, resulting in metal residues. Moreover, the technical threshold and production costs of etching solutions which meet the requirements of different thickness specifications, sizes, and sharp corner characteristics are high.

Therefore, the prior art has defects and needs to be urgently solved.

Technical Problems

The present disclosure provides an etching method of a copper-molybdenum film and an array substrate, which can solve the problems that a conventional etching process of a copper-molybdenum film easily causes metal residues and high production costs.

SUMMARY OF INVENTION

Technical Solutions

To solve the above problems, the technical solutions provided by the present disclosure are as follows:

A etching method of a copper-molybdenum film includes:
step S10 of forming a copper-molybdenum film on a substrate;
step S20 of forming a photoresist in a predetermined pattern on the copper-molybdenum film;
step S30 of etching a copper film of the copper-molybdenum film with an acidic first etching solution;
step S40 of etching a molybdenum film of the copper-molybdenum film with a neutral or basic second etching solution, to form the copper-molybdenum film in the predetermined pattern.

In the etching method in accordance with the present disclosure, a PH value of the first etching solution ranges from 0 to 5.

In the etching method in accordance with the present disclosure, the PH value of the first etching solution ranges from 1 to 2.

In the etching method in accordance with the present disclosure, a pH value of the second etching solution ranges from 6 to 9.

In the etching method in accordance with the present disclosure, the first etching solution includes one or more of an inorganic acid and an organic acid, and further includes a chelating agent, an inhibitor, and deionized water.

In the etching method in accordance with the present disclosure, the organic acid is one or more combinations of acetic acid, glycolic acid, 2-hydroxypropane-1,2,3-tricarboxylic acid, benzoic acid, oxalic acid, succinic acid, 2,3-dihydroxysuccinic acid, 2-hydroxysuccinic acid, 2-hydroxypropionic acid, and phthalic acid; and the inorganic acid is one or more combinations of hydrogen peroxide, nitric acid, sulfuric acid, hydrochloric acid, phosphoric acid, hypochlorous acid, and permanganic acid.

In the etching method in accordance with the present disclosure, the second etching liquid includes an inorganic salt, a chelating agent, an inhibitor, and deionized water.

In the etching method in accordance with the present disclosure, the inorganic salt is one or more combinations of sodium chloride, magnesium chloride, potassium chloride, sodium sulfate, magnesium sulfate, potassium sulfate, sodium nitrate, magnesium nitrate, potassium nitrate, sodium acetate, magnesium acetate and potassium acetate.

In the etching method in accordance with the present disclosure, the chelating agent is one or more combinations of sodium stannate, sodium pyrophosphate, 8-hydroxyquinoline, and chitosan; and the inhibitor is one or more combinations of 6-nitrobenzimidazole, 2-aminothiazole, 2-amino-5-nitrothiazole, 5-aminotetrazole, 3-amino-1,2,4-triazole, benzotriazole, benzotriazole, sodium triazole, and mercaptobenzotriazole.

The present disclosure also provides an array substrate including the copper-molybdenum film in the predetermined pattern formed by the etching method as described above.

To solve the above problems, the present disclosure further includes the following steps:
step S10 of sequentially forming a molybdenum film and a copper film on the substrate to form a copper-molybdenum film;
step S20 of forming a photoresist in a predetermined pattern on the copper-molybdenum film;
step S30 of etching a copper film of the copper-molybdenum film with an acidic first etching solution;
step S40 of etching a molybdenum film of the copper-molybdenum film with a neutral or basic second etching solution, to form the copper-molybdenum film in the predetermined pattern.

In the etching method in accordance with the present disclosure, a PH value of the first etching solution ranges from 0 to 5.

In the etching method in accordance with the present disclosure, the PH value of the first etching solution ranges from 1 to 2.

In the etching method in accordance with the present disclosure, a pH value of the second etching solution ranges from 6 to 9.

In the etching method in accordance with the present disclosure, the first etching solution includes one or more of an inorganic acid and an organic acid, and further includes a chelating agent, an inhibitor, and deionized water.

In the etching method in accordance with the present disclosure, the organic acid is one or more combinations of acetic acid, glycolic acid, 2-hydroxypropane-1,2,3-tricarboxylic acid, benzoic acid, oxalic acid, succinic acid, 2,3-dihydroxysuccinic acid, 2-hydroxysuccinic acid, 2-hydroxypropionic acid, and phthalic acid; and the inorganic acid is one or more combinations of hydrogen peroxide, nitric acid, sulfuric acid, hydrochloric acid, phosphoric acid, hypochlorous acid, and permanganic acid.

In the etching method in accordance with the present disclosure, the second etching liquid includes an inorganic salt, a chelating agent, an inhibitor, and deionized water.

In the etching method in accordance with the present disclosure, the inorganic salt is one or more combinations of sodium chloride, magnesium chloride, potassium chloride, sodium sulfate, magnesium sulfate, potassium sulfate, sodium nitrate, magnesium nitrate, potassium nitrate, sodium acetate, magnesium acetate and potassium acetate.

In the etching method in accordance with the present disclosure, the chelating agent is one or more combinations of sodium stannate, sodium pyrophosphate, 8-hydroxyquinoline, and chitosan; and the inhibitor is one or more combinations of 6-nitrobenzimidazole, 2-aminothiazole, 2-amino-5-nitrothiazole, 5-aminotetrazole, 3-amino-1,2,4-triazole, benzotriazole, benzotriazole, sodium triazole, and mercaptobenzotriazole.

Beneficial Effects

The beneficial effects of the present disclosure are as follows: In the etching method of the copper-molybdenum film and the array substrate provided in the present disclosure, by etching the copper film of the copper-molybdenum film with an acidic first etching solution, and by etching the molybdenum film of the copper-molybdenum film with an basic second etching solution, the copper-molybdenum film in the predetermined pattern is formed. In this present disclosure, based upon the potential range difference between the corrosion occurring to copper and molybdenum, the etching solutions with different pH values are used, and the etching process of the copper-molybdenum film divided into multiple phases is performed only by controlling the etching process of a single layer of the copper or a single layer of molybdenum. Therefore, the technical problems are solved that a conventional etching process of a copper-molybdenum film easily causes metal residues and high production costs.

BRIEF DESCRIPTION OF DRAWINGS

The technical solutions and other beneficial effects of the present disclosure is made clear through the detailed description of the specific embodiments of the present disclosure in conjunction with the accompanying drawings.

The technical solutions and other beneficial effects of the present disclosure is made clear through the detailed description of the specific embodiments of the present disclosure in conjunction with the accompanying drawings.

DETAILED DESCRIPTION OF PREFERRED EMBODIMENTS

Figure 1:
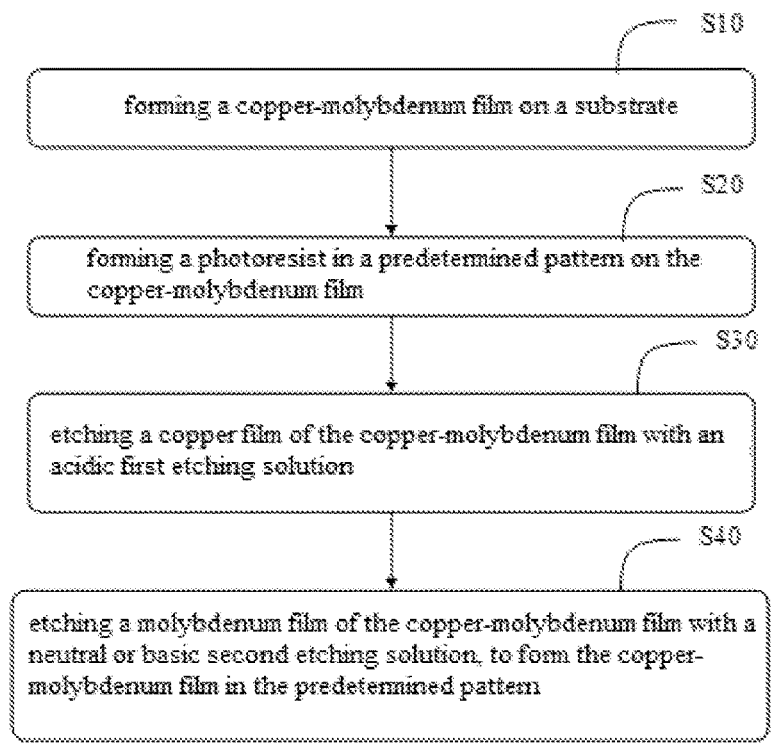
FIG. 1 is a flowchart of an etching method of a copper-molybdenum film provided by an embodiment of the present disclosure.

The technical solutions in the embodiments of the present disclosure are clearly and completely described as follows with reference to the accompanying drawings in the embodiments. It is apparent that the described embodiments are only a part of the embodiments of the present disclosure, and not all of the embodiments. All other embodiments obtained by a person skilled in the art based on the embodiments of the present disclosure without inventive efforts are within the scope of the present disclosure.

In the description of the present disclosure, it is to be understood that the oriental and the positional relationships of the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc. are based upon the oriental or positional relationship shown in the drawings, are merely for facilitating and simplifying the description of the present disclosure, and do not indicate or imply that the device or components referred to have a specific orientation, and are constructed and operated in a specific orientation. Therefore, it should not be construed as limiting the disclosure. Moreover, the terms "first" and "second" are used for descriptive purposes only and are not to be construed as indicating or implying a relative importance or implicitly indicating the number of indicated technical features. Thus, features defining "first" or "second" may include one or more of the described features either explicitly or implicitly. In the description of the present disclosure, the meaning of "a plurality of" is two or more unless specifically defined otherwise.

For the sake of simplicity and clarity, the reference numerals and/or the reference letters may repeat in different examples in the present disclosure, which does not indicate the relationship between the various discussed embodiments and/or arrangements.

The present disclosure aims to the technical problems that a conventional etching process of a copper-molybdenum film easily causes metal residues and high production costs.

Refer to FIG. 1, which is a flowchart of an etching method of a copper-molybdenum film provided by an embodiment of the present disclosure. The etching method includes the following steps:

Step S10 of forming a copper-molybdenum film on a substrate.

The substrate may be a glass substrate, and the copper-molybdenum film is deposited on the glass substrate by physical vapor deposition. Specifically, a molybdenum film is first deposited on a surface of the substrate, and then, a copper film is deposited on a surface of the molybdenum film to form a laminated copper-molybdenum film. The role of molybdenum is described above in the background of disclosure, and is not repeated herein.

Step S20 of forming a photoresist in a predetermined pattern on the copper-molybdenum film.

A photoresist film is first coated on a surface of the copper-molybdenum film, then a photomask is used to expose and develop the photoresist film in specific regions, parts of the photoresist are removed, and finally, the photoresist in a predetermined pattern is obtained.

Step S30 of etching the copper film of the copper-molybdenum film with an acidic first etching solution.

The first etching solution includes one or more of an inorganic acid and an organic acid, and further includes a chelating agent, an inhibitor, and deionized water.

The organic acid includes, but is not limited to, one or more combinations of acetic acid, glycolic acid, 2-hydroxypropane-1,2,3-tricarboxylic acid, benzoic acid, oxalic acid, succinic acid, 2,3-dihydroxysuccinic acid, 2-hydroxysuccinic acid, 2-hydroxypropionic acid, and phthalic acid.

The inorganic acid includes, but is not limited to, one or more combinations of hydrogen peroxide, nitric acid, sulfuric acid, hydrochloric acid, phosphoric acid, hypochlorous acid, and permanganic acid.

A PH value of the first etching solution ranges from 0 to 5.

Furthermore, the PH value of the first etching solution ranges from 0 to 4.

Furthermore, the PH value of the first etching solution ranges from 1 to 2.

Step S40 of etching the molybdenum film of the copper-molybdenum film with a neutral or basic second etching solution, to form the copper-molybdenum film in the predetermined pattern.

The second etching liquid includes an inorganic salt, a chelating agent, an inhibitor, and deionized water.

The inorganic salt is one or more combinations of sodium chloride, magnesium chloride, potassium chloride, sodium sulfate, magnesium sulfate, potassium sulfate, sodium nitrate, magnesium nitrate, potassium nitrate, sodium acetate, magnesium acetate and potassium acetate.

A pH value of the second etching solution ranges from 6 to 9.

In the present disclosure, the chelating agent includes, but does not limit to, one or more combinations of sodium stannate, sodium pyrophosphate, 8-hydroxyquinoline, and chitosan; and the inhibitor is one or more combinations of 6-nitrobenzimidazole, 2-aminothiazole, 2-amino-5-nitrothiazole, 5-aminotetrazole, 3-amino-1,2,4-triazole, benzotriazole, benzotriazole, sodium triazole, and mercaptobenzotriazole.

In addition, both the first etchant and the second etchant may contain a regulator, and the regulator is one or more combinations of diisopropanolamine, polyacrylamide, m-phenylenediamine, p-chloroaniline, and isopropanolamine.

In the disclosure, corrosions occur to copper and molybdenum within significantly different potential ranges, and the etching solutions with different pH values are employed. The etching process of the copper-molybdenum film divided into multiple phases is performed only by controlling the etching process of a single layer of the copper/a single layer of molybdenum.

The etching method of etching the copper-molybdenum film of the present disclosure is described in detail below with reference to specific embodiments.

Embodiment 1

Figure 2A:
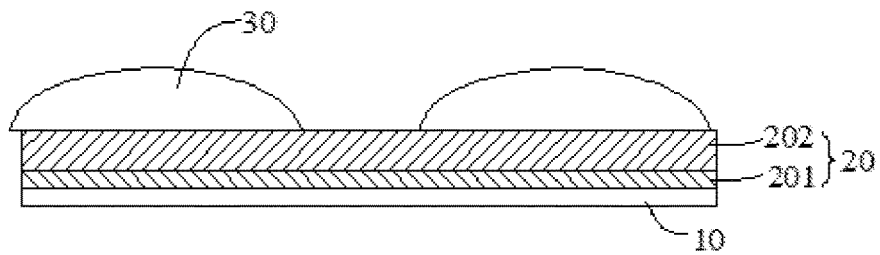
FIG. 2A-FIG. 2C are schematic diagrams of an etching process of a copper-molybdenum film provided in a first embodiment of the present disclosure.
Figure 2B:
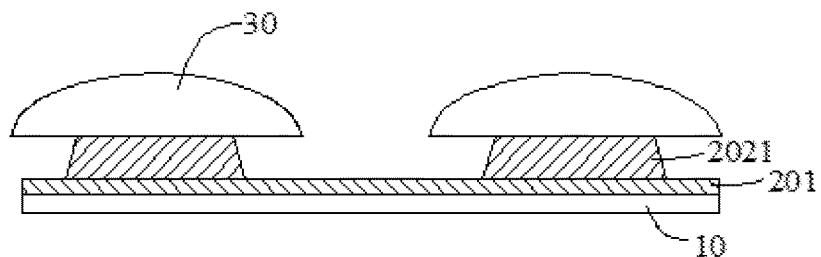
Figure 2C:
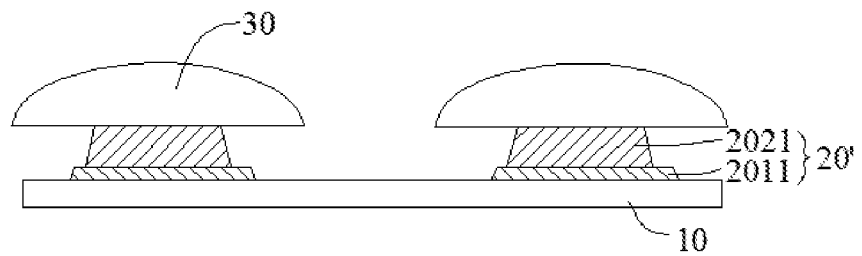

Refer to FIG. 2A to FIG. 2C, which are schematic diagrams of an etching process of a copper-molybdenum film provided in a first embodiment of the present disclosure.

As shown in FIG. 2A, a copper-molybdenum film 20 is formed on a substrate 10, then a photoresist film is coated on a surface of the copper-molybdenum film 20, and then the photoresist film is patterned to finally obtain a photoresist 30 in a predetermined pattern.

As shown in FIG. 2B, the copper film 202 of the copper-molybdenum film 20 is etched with the first etching solution to form a copper metal pattern 2021 in the predetermined pattern, and the molybdenum film 201 is left unetched.

Under acidic conditions, especially at a pH value ranging from 0 to 4, the copper film 202 is easily etched, while the molybdenum film 201 is not easily etched. Furthermore, by adding a chelating agent and an inhibitor, that are selective to copper/molybdenum, into the first etching solution, an interface of the molybdenum film 201 is not corroded during the etching process of the copper film 202, and the etching of the first copper film 202 is completed.

Furthermore, under the condition of a pH value ranging from 1 to 2, the copper film 202 can be etched faster, and the etching duration for completing the etching of a critical size (CD loss) of 1 μm is about 10 s, which satisfies the requirement of the existing process design. Under the condition of the pH value ranging from 1 to 2, the safety and service life of the etching solution are better than the existing copper acid (4 k-10 k ppm), and the service life is designed as 15 k-20 k ppm. In terms of production costs, due to no need to consider the relative etching control of copper and molybdenum, the expensive heterocyclic compound additives in the etching solution are not needed. That is, there are both production efficiency and cost advantages.

As shown in FIG. 2C, the molybdenum film 201 of the copper-molybdenum film 20 is etched with the second etching solution to form a molybdenum metal pattern 2011 in the predetermined pattern. The copper metal pattern 2021 and the molybdenum metal pattern 2011 form the copper-molybdenum film 20' in the predetermined pattern.

In the neutral to weakly basic (pH 6-9) etching solution, the molybdenum film 201 is easily removed and dissolved, while the copper film 202 is hardly etched under the condition of pH>7. By controlling the etching rates of the copper film and the molybdenum film and the sharp corner characteristics of the copper-molybdenum film 20', the second phase of the etching process for the molybdenum film 201 is completed.

Embodiment 2

Refer to FIG. 3A-FIG. 3D, which are schematic diagrams of an etching process of a copper-molybdenum film provided in a second embodiment of the present disclosure.

Figure 3A:
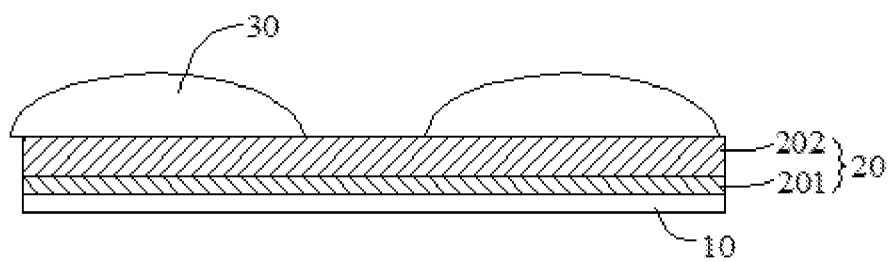
FIG. 3A-FIG. 3D are schematic diagrams of an etching process of a copper-molybdenum film provided in a second embodiment of the present disclosure.

As shown in FIG. 3A, a copper-molybdenum film 20 is formed on a substrate 10, then a photoresist film is coated on a surface of the copper-molybdenum film 20, and then the photoresist film is patterned to finally obtain a photoresist 30 in a predetermined pattern.

Figure 3B:
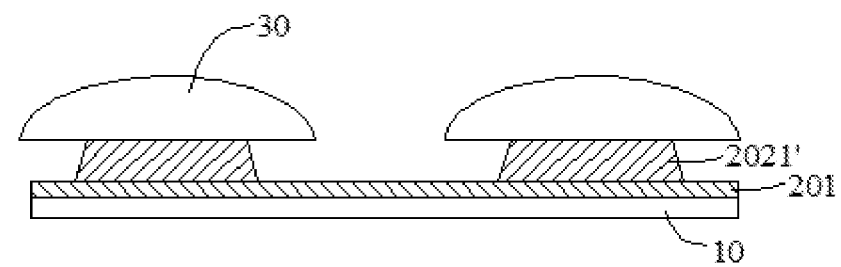

As shown in FIG. 3B, the copper film 202 of the copper-molybdenum film 20 is etched with the first etching solution to form a copper metal pattern 2021' in an intermediate state, and the molybdenum film 201 is left unetched.

Figure 3C:
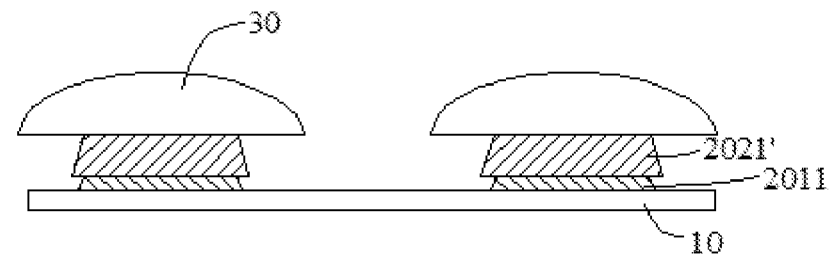

As shown in FIG. 3C, the molybdenum film 201 of the copper-molybdenum film 20 is over-etched with the second etching solution to form a molybdenum metal pattern 2011 in the predetermined pattern. A cross-sectional width of the molybdenum metal pattern 2011 is slightly smaller than a cross-sectional width of the copper metal pattern 2021' in the intermediate state.

Figure 3D:
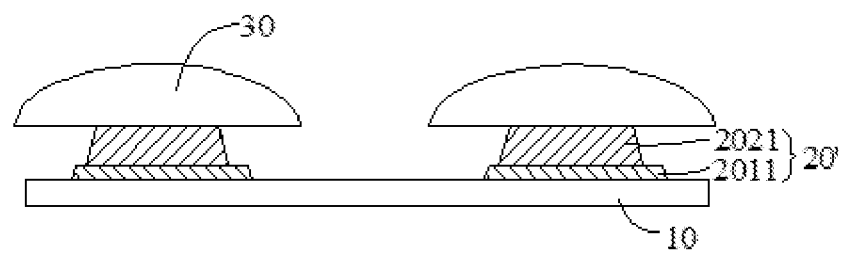

As shown in FIG. 3D, the copper metal pattern 2021' in the intermediate state is micro-etched with the first etching solution, and finally a copper metal pattern 2021 is formed. The copper metal pattern 2021 and the molybdenum metal pattern 2011 form the copper-molybdenum metal layer 20' in the predetermined pattern.

In this disclosure, since the etching process of the copper-molybdenum film divided into multiple phases is performed, the etching characteristics are not likely to change, thereby solving the problem of metal residues in the conventional etching process, while meeting the requirements of different thickness specifications, sizes, and sharp corner characteristics and reducing production costs.

The present disclosure also provides an array substrate including a copper-molybdenum metal film in a predetermined pattern formed by the etching method as described above. The array substrate includes, but is not limited to, an active layer, a gate, and a source/drain, wherein the material of the gate and/or the source and the drain is a copper-molybdenum metal material.

Certainly, the other metal layers on the array substrate may also be the copper-molybdenum metal material, which is not limited herein.

In the etching method of the copper-molybdenum film and the array substrate provided in the present disclosure, by etching the copper film of the copper-molybdenum film with an acidic first etching solution, or by etching the molybdenum film on the copper-molybdenum film with an basic second etching solution, the copper-molybdenum film in the predetermined pattern is formed. In this present disclosure, based upon the potential range difference between the corrosion occurring to copper and molybdenum, the etching solutions with different pH values are used, and the etching process of the copper-molybdenum film divided into multiple phases is performed only by controlling the etching process of a single layer of the copper or a single layer of molybdenum. Therefore, the technical problems are solved that a conventional etching process of a copper-molybdenum film easily causes metal residues and high production costs.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A etching method of a copper-molybdenum composite film comprising:
   step S10 of sequentially forming a molybdenum film and a copper film on the substrate to form a copper-molybdenum composite film;
   step S20 of forming a photoresist in a predetermined pattern on the copper-molybdenum composite film;
   step S30 of etching a copper film of the copper-molybdenum composite film with an acidic first etching solution to form an intermediate copper metal pattern;
   step S40 of etching the molybdenum film of the copper-molybdenum composite film with a neutral or basic second etching solution, to form a molybdenum metal pattern, wherein a cross-sectional width of the molybdenum metal pattern is less than a cross-sectional width of the intermediate copper metal pattern;
   step S50 of etching the intermediate copper metal pattern with the first etching solution to form a final copper metal pattern; wherein the molybdenum metal pattern and the final copper metal pattern form the copper-molybdenum metal layer in the predetermined pattern;
   wherein a PH value of the acidic first etching solution ranges from 0 to 2, a pH value of the neutral or basic second etching solution ranges from 6 to 9, and the step S40 is performed after the step S30.

2. The etching method as claimed in claim 1, wherein the PH value of the acidic first etching solution ranges from 1 to 2.

3. The etching method as claimed in claim 1, wherein the acidic first etching solution includes one or more of an inorganic acid and an organic acid, and further includes a chelating agent, an inhibitor, and deionized water.

4. The etching method as claimed in claim 3, wherein the organic acid is one or more combinations of acetic acid, glycolic acid, 2-hydroxypropane-1,2,3-tricarboxylic acid, benzoic acid, oxalic acid, succinic acid, 2,3-dihydroxysuccinic acid, 2-hydroxysuccinic acid, 2-hydroxypropionic acid, and phthalic acid; and
   the inorganic acid is one or more combinations of hydrogen peroxide, nitric acid, sulfuric acid, hydrochloric acid, phosphoric acid, hypochlorous acid, and permanganic acid.

5. The etching method as claimed in claim 1, wherein the neutral or basic second etching liquid includes an inorganic salt, a chelating agent, an inhibitor, and deionized water.

6. The etching method as claimed in claim 5, wherein
   the inorganic salt is one or more combinations of sodium chloride, magnesium chloride, potassium chloride, sodium sulfate, magnesium sulfate, potassium sulfate, sodium nitrate, magnesium nitrate, potassium nitrate, sodium acetate, magnesium acetate and potassium acetate.

7. The etching method as claimed claim 5, wherein the chelating agent is one or more combinations of sodium stannate, sodium pyrophosphate, 8-hydroxyquinoline, and chitosan; and the inhibitor is one or more combinations of 6-nitrobenzimidazole, 2-aminothiazole, 2-amino-5-nitrothiazole, 5-aminotetrazole, 3-amino-1,2,4-triazole, benzotriazole, benzotriazole, sodium triazole, and mercaptobenzotriazole.

* * * * *